United States Patent
Urbanowicz et al.

(10) Patent No.: US 7,964,039 B2
(45) Date of Patent: Jun. 21, 2011

(54) CLEANING OF PLASMA CHAMBER WALLS USING NOBLE GAS CLEANING STEP

(75) Inventors: Adam Michal Urbanowicz, Wroclaw (PL); Mikhaïl Baklanov, Veltem-Beisem (BE); Denis Shamiryan, Leuven (BE); Stefan De Gendt, Wijnegem (BE)

(73) Assignees: IMEC, Leuven (BE); Katholieke Universiteit Leuven K.U. Leuven R&D, Leuven (BE)

( * ) Notice: Subject to any disclaimer, the term of this patent is extended or adjusted under 35 U.S.C. 154(b) by 319 days.

(21) Appl. No.: 12/205,596

(22) Filed: Sep. 5, 2008

(65) Prior Publication Data

US 2009/0065025 A1 Mar. 12, 2009

Related U.S. Application Data

(60) Provisional application No. 61/050,878, filed on May 6, 2008, provisional application No. 60/970,844, filed on Sep. 7, 2007.

(51) Int. Cl.
*B08B 7/00* (2006.01)
*B08B 7/04* (2006.01)
*B08B 9/00* (2006.01)

(52) U.S. Cl. ............ 134/18; 134/1; 134/1.1; 134/26; 134/22.18; 134/1.2; 134/1.3

(58) Field of Classification Search .............. 134/1, 1.1, 134/1.2, 1.3, 26, 18, 902, 22.18, 22.1; 438/905
See application file for complete search history.

(56) References Cited

U.S. PATENT DOCUMENTS

| 5,221,426 A | 6/1993 | Tessier et al. |
| 2005/0016838 A1* | 1/2005 | Murata et al. ............ 204/192.32 |
| 2005/0133059 A1* | 6/2005 | Chen et al. .................... 134/1.1 |
| 2006/0203239 A1* | 9/2006 | Powell et al. ................. 356/316 |

OTHER PUBLICATIONS

Kuo et al., "Room-temperature copper etching based on a plasma-copper reaction." Applied Physics Letters, 2001, vol. 78, No. 7 (2001).
Macko et al., Plasma Sources Sci. Technol., 13 (2004), p. 251-262.
Urbanowicz et al., "Effect of Helium Plasma on Low-k damage during Dry Resist Strip" Proceedings of plasma etch and strip workshop, Leuven, 2007.

* cited by examiner

*Primary Examiner* — Alexander Markoff
(74) *Attorney, Agent, or Firm* — Knobbe Martens Olson & Bear LLP

(57) ABSTRACT

An improved reaction chamber cleaning process is provided for removing water residues that makes use of noble-gas plasma reactions. The method is easy applicable and may be combined with standard cleaning procedure. A noble-gas plasma (e.g. He) that emits high energy EUV photons (E>20 eV) which is able to destruct water molecules to form electronically excited oxygen atoms is used to remove the adsorbed water.

9 Claims, 4 Drawing Sheets

CLEANING OF PLASMA CHAMBER WALLS USING NOBLE GAS CLEANING STEP

CROSS-REFERENCE TO RELATED APPLICATIONS

This application claims the benefit under 35 U.S.C. §119 (e) of U.S. provisional application Ser. No. 61/050,878 filed May 6, 2008 and U.S. provisional application Ser. No. 60/970,844 filed on Sep. 7, 2007, the disclosures of which are hereby expressly incorporated by reference in their entirety and are hereby expressly made a portion of this application.

FIELD OF THE INVENTION

The preferred embodiments relate to method of cleaning a processing chamber such as a reactive ion etching chamber to remove previously deposited chamber residues, which have accumulated on interior surfaces of the apparatus. In particular, the preferred embodiments relate to an optimized wafer-less plasma cleaning method for the substantial elimination of residues on interior walls of the processing chamber, or other components inside the processing chamber. The method according to preferred embodiments can be used to remove water residues which have been accumulated on the interior of a reaction chamber. Preferably the method of preferred embodiments is used in a plasma reaction chamber making use of noble-gas plasma reactions.

BACKGROUND OF THE INVENTION

A critical issue in integration of porous materials, such as e.g. low-k materials, in semiconductor processing is the degradation of their properties, e.g. their dielectric properties as expressed by its dielectric constant k. Porous low-k materials are more sensitive in comparison to conventional dielectric materials such as, for example, silicon dioxide. The open porosity of porous low-k materials significantly increases diffusivity of water species. As a result, polar water groups are incorporated into the porous structure which may increase the dielectric constant or k-value of the material. This leads to an increase in k-value for the porous material and converts the inherently hydrophobic low-k material into a hydrophilic material. Subsequent adsorption of moisture, e.g. water, or other polar molecules having high polarizability, mediated by hydrogen bonding, can significantly increase the effective k-value of the material, e.g. to a k-value$>>80$.

To avoid water absorption and/or water radicals into the pores of the low-k material during patterning of the low-k material in a dry etching chamber it has become increasingly important that the environment inside the processing chamber is clean and that water residues are avoided. As is known in the art, many of the processes carried out within the semiconductor processing chambers leave deposits on the inner surfaces of the processing chamber.

The currently used chamber walls cleaning recipes in low temperature operating chambers (20° C.-75° C.) are introducing water on chamber walls (as a by product reaction of cleaning chemistry with polymers on chamber walls). The water bonded on the chamber walls is released during the plasma processing. The released water is a source of additional O* and H* radicals in the used plasma mixture as shown in FIG. 1. The presence of the additional species released from the chamber walls (such as H* and O* radicals) during the process has an influence on the plasma processing of the material. Moreover after the conventional cleaning some amount of particles bonded to the plasma chamber walls still remains.

The typical plasma cleaning chemistries use $SF_6$ and $O_2$ based chemistry. The $SF_6$ plasma removes polymers on chamber walls and $O_2$ removes residual carbon but these plasma cleaning chemistries do not remove water residues.

SUMMARY OF THE INVENTION

There is a need to remove residual water and some part of the remained particles (after previous reactive plasma cleaning) from the plasma chamber walls.

The preferred embodiments can provide an easy and quick cleaning method to remove water residues from a plasma chamber (walls).

An improved reaction chamber cleaning process is disclosed to remove water residues making use of noble-gas plasma reactions.

The method of preferred embodiments is easily applied and may be combined with standard cleaning procedure. A noble-gas plasma (e.g. He) that emits high energy EUV photons (E>20 eV) which is able to destruct water molecules to form electronically excited oxygen atoms is used to remove the adsorbed water.

This achieved by introducing an additional noble-gas-plasma cleaning step which removes residual water and some part of the remained particles (preferably after previous reactive plasma cleaning) from the plasma chamber walls.

The method of preferred embodiments can be a modification of currently existing Wafer-Less Auto Cleaning (WAC) recipes. The modification can be realized by adding an additional noble-gas-plasma cleaning step.

The bonded water and molecules (for instance polymer like) on plasma chamber walls can be removed by an additional noble-gas-plasma cleaning step.

According to preferred embodiments, the noble-gas-plasma cleaning step is performed using a He or Ar plasma. The energy of ultra-violet (UV) radiation and metastable atoms from the noble gases is sufficient to remove water and also some part of the residual molecules bonded on the plasma chamber walls after the previous reactive-plasma cleaning steps.

The method according to preferred embodiments can be combined with OES (optical Emission Spectroscopy) to monitor the removal of the contamination.

In its broadest form, the preferred embodiments provide a method for removing water residues from a plasma chamber. The method comprises:
  exposing the plasma chamber to a noble gas plasma, the noble gas plasma being able to emit photons having sufficient energy to cause photolysis of water molecules adsorbed on the reaction chamber so as to release radicals of these adsorbed molecules, and
  removing the released radicals from the reaction chamber.

In one embodiment, a method is further provided for monitoring the water contamination in a plasma chamber. The method comprises:
  exposing the plasma chamber to a noble gas plasma, the noble gas plasma being able to emit Extreme Ultra Violet and/or Vacuum Ultra Violet photons having sufficient energy to cause photolysis of water molecules adsorbed to the chamber so as to release oxygen, hydrogen and/or hydroxyl radicals,
  detecting the amount of released oxygen, hydrogen and/or hydroxyl radicals, and quantifying the water contamination of the plasma chamber from the amount of released oxygen, hydrogen and/or hydroxyl radicals.

Detecting the amount of released oxygen, hydrogen and/or hydroxyl radicals may be performed by optical emission spectroscopy, laser induced fluorescence or mass spectrometry.

According to preferred embodiments, detecting the amount of released oxygen, hydrogen and/or hydroxyl radicals may be performed by detecting oxygen radicals using optical emission spectroscopy at a predetermined wavelength, e.g. 777 nm.

The noble-gas plasma cleaning step according to preferred embodiments is suitable to remove water residues in a reactive ion etching chamber using a He or Ar plasma.

According to preferred embodiments, the method may be performed in combination with existing plasma chamber cleaning procedures such as e.g. Wafer-less Auto Clean procedures using a plasma of $O_2/SF_6$ or an $O_2/Cl_2$ plasma. These state of the art cleaning procedures are suitable for removing contaminants mainly consisting of organic polymeric residues.

Particular and preferred aspects of embodiments are set out in the accompanying independent and dependent claims. Features from the dependent claims may be combined with features of the independent claims and with features of other dependent claims as appropriate and not merely as explicitly set out in the claims.

The above and other characteristics, features and advantages of preferred embodiments will become apparent from the following detailed description, taken in conjunction with the accompanying drawings, which illustrate, by way of example, the principles of preferred embodiments. This description is given for the sake of example only, without limiting the scope of preferred embodiments. The reference figures quoted below refer to the attached drawings.

BRIEF DESCRIPTION OF THE DRAWINGS

FIG. 3 illustrates the 777 nm intensity signal related to O* radicals (5P-5S transition).

DETAILED DESCRIPTION OF PREFERRED EMBODIMENT

Figure 1:
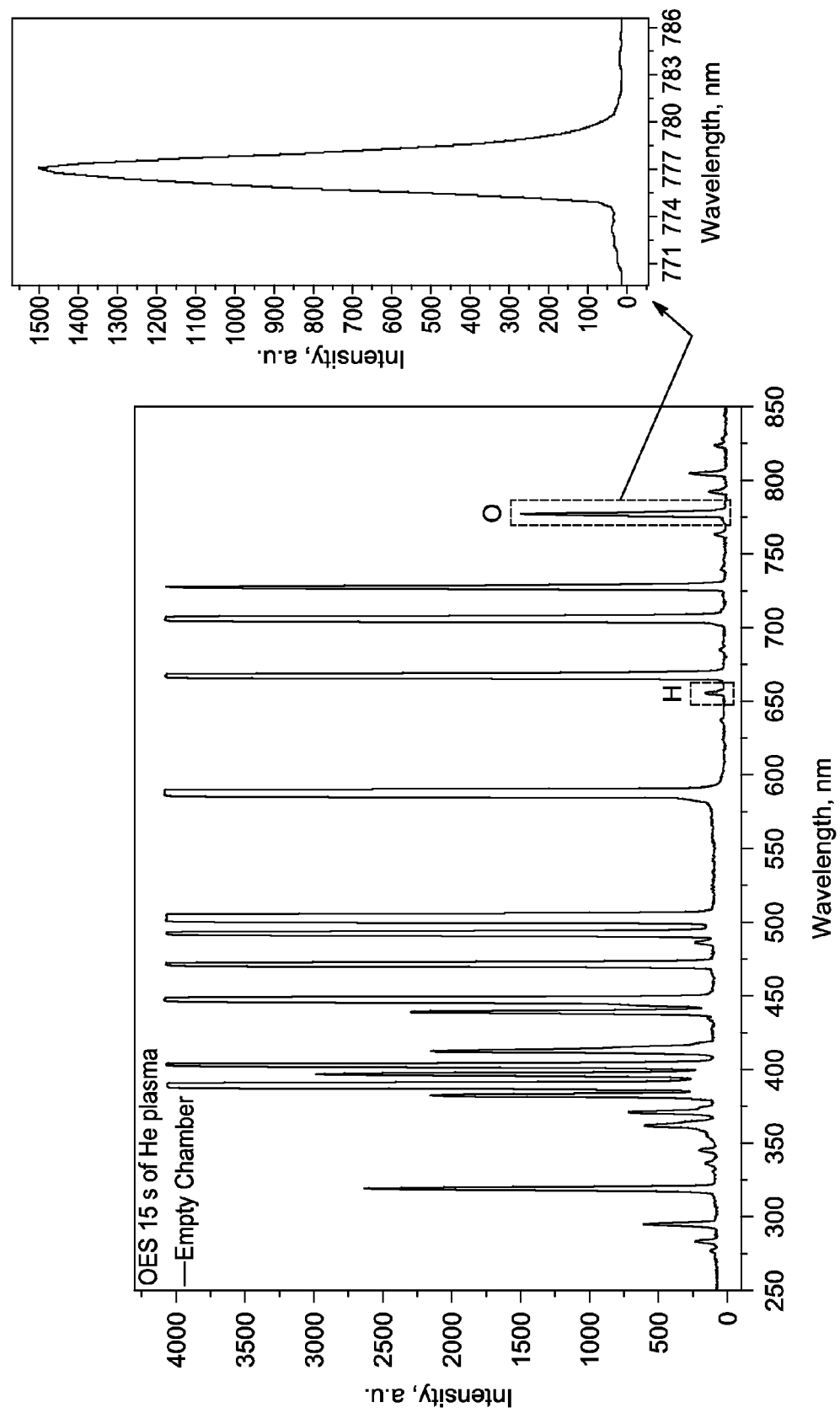
FIG. 1 schematically illustrates an optical emission spectra of pure He plasma recorded in empty chamber. The emissions related to O* (777 nm) and H* (657 nm) radicals are observed.

The preferred embodiments will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of preferred embodiments.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the preferred embodiments, the only relevant components of the device are A and B.

Reference throughout this specification to "one embodiment" or "an embodiment" means that a particular feature, structure or characteristic described in connection with the embodiment is included in at least one embodiment of preferred embodiments. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary preferred embodiments, various features of preferred embodiments are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of preferred embodiments, and form different embodiments, as would be understood by those in the art. For example, in the following claims, any of the claimed embodiments can be used in any combination.

In the description provided herein, numerous specific details are set forth. However, it is understood that preferred embodiments may be practised without these specific details. In other instances, well-known methods, structures and techniques have not been shown in detail in order not to obscure an understanding of this description.

The following terms are provided solely to aid in the understanding of preferred embodiments.

The terms "electrostatic chucking" and "electrostatic de-chucking" refer to steps which are used to respectively fix and release a sample, e.g. a wafer, onto or from a wafer holder in a plasma etch chamber. To perform "chucking" or "de-chucking" the wafer can shortly be exposed to a plasma, e.g. a He plasma, to charge or discharge the sample, e.g. wafer, and in that way fix or release the sample, e.g. wafer, onto/from the sample holder.

The invention will now be described by a detailed description of several preferred embodiments. It is clear that other preferred embodiments can be configured according to the knowledge of persons skilled in the art without departing from the technical teaching of preferred embodiments, the invention being limited only by the terms of the appended claims.

The preferred embodiments provides a method for removing water residues from a surface, preferably the method is used to remove water residues from surface(s) of a plasma reaction chamber thereby using a noble-gas plasma (referred to as a noble-gas plasma cleaning).

The method comprises:
 exposing the surface to a noble gas plasma, the noble gas plasma being able to emit Extreme Ultra Violet and/or Vacuum Ultra Violet photons having sufficient energy to cause photolysis of water molecules adsorbed to the surface so as to release oxygen, hydrogen and/or hydroxyl radicals, and
 removing the oxygen, hydrogen and/or hydroxyl radicals from the reaction chamber to avoid re-deposition on the surface.

According to preferred embodiments, the amount of released oxygen, hydrogen and/or hydroxyl radicals may be monitored using optical emission spectrometry (OES).

FIG. 1 schematically illustrates an Optical Emission Spectra of pure He plasma recorded in empty chamber. The emissions related to O* (777 nm) and H* (657 nm) radicals are observed.

The method according to preferred embodiments is quick, and easily applicable.

The method according to preferred embodiments can be used in combination with state of the art cleaning processes such as Waferless Auto Clean procedures using a plasma of $O_2/SF_6$ or an $O_2/Cl_2$ plasma. Preferably the noble-gas plasma cleaning step is performed after the WAC cleaning step.

According to preferred embodiments, the adsorption of water onto the surface of a reaction chamber walls may be the result or by-product of the reaction of organic hydrophobic groups during exposure of a material, e.g. during the plasma etching (patterning) of a porous organic low-k material using e.g. an $O_2$ plasma.

The method according to preferred embodiments is based on the exposure of a surface to a plasma that is able to emit EUV (Extreme Ultra Violet) and/or VUV (far or Vacuum Ultra Violet) photons having sufficient energy to dissociate water molecules adsorbed to the material so as to release oxygen, hydrogen and/or hydroxyl radicals. The plasma may for example, be a low pressure plasma with a minimum power of approximately 100 Watt (no bias is applied). According to preferred embodiments the plasma may comprise at least one compound selected from the group of noble gases with an atomic weight less than Xe, such as He and Ar. More heavy noble gases will emit radiation with an energy that is not sufficient to dissociate water. It was found that exposure to a noble gas plasma causes photolysis of water thereby forming O*, OH* and/or H* radicals.

A method according to preferred embodiments may make use of chemiluminescence. Chemiluminescence or, in other words, emission of light, is the result of a decay from an excited state of a molecule or atom to a lower energy level. In theory one photon of light should be emitted for each molecule or atom going back to a lower energy level. Chemiluminescence can be monitored using optical emission spectrometry (OES).

Products of the above-described noble-gas plasma cleaning reactions, i.e. O*, OH* and/or H* radicals can be detected by, for example, Optical Emission Spectrometry (OES). Analysis of radiation intensities at particular wavelengths may then reveal information on the level of water contamination. For example, for O* radicals, analysis of radiation intensities at a wavelength of 777 nm may give information about the residual contamination. Furthermore, H* radicals can be monitored at a wavelength of 656 nm and OH* radicals can be monitored at a wavelength of 309 nm. OES may be performed or a spectrum may simultaneously be monitored during the noble-gas plasma cleaning.

According to preferred embodiments, the noble-gas plasma cleaning is used to remove water residues from a reaction chamber and a wafer is placed onto the wafer holder (chuck) to protect the wafer holder during exposure to the noble-gas plasma.

According to preferred embodiments, the noble-gas plasma cleaning procedure may be carried out (is suitable for) in a LAM Versys2300 STAR plasma chamber equipped with OES (optical emission spectroscopy) analyzer with spectral resolution 2.5 nm. The spectra were recorded in the range of 250 nm-850 nm.

According to preferred embodiments, the noble-gas plasma cleaning procedure may be carried out at 30 mTorr 400 W (coil power) and 0 W of bias power during the noble gas (e.g. He) plasma exposure. The noble gas (e.g. He) flow may be 400 sccm. The temperature during the noble-gas plasma cleaning is preferably close to room-temperature up to 70° C., for example 30° C. The time of He plasma exposure may be 6 seconds for plasma de-chuck and 20 s for chamber cleaning respectively. As shown in FIG. 3 the shortest time of noble gas (e.g. He) plasma exposure (with parameters described above) required to clean the chamber is 15 seconds (2.5 longer than for He plasma de-chuck).

According to preferred embodiments, the noble-gas plasma cleaning procedure may be carried out using a (noble) gas pressure range from 3 mTorr (0.39 Pa) up to 80 mTorr (10.66 Pa)

According to preferred embodiments, the noble-gas plasma cleaning procedure may be carried out for a time period of 15 seconds up to 100 seconds. This exposure time further depends on other parameters such as coil power and gas pressure.

According to preferred embodiments, the noble-gas plasma cleaning procedure may be carried out using a (noble) gas flow in the range of 100 sccm up to 1500 sccm.

According to preferred embodiments, the noble-gas plasma cleaning procedure may be carried out using a coil power in the range of 400 W up to 2000 W.

According to preferred embodiments, the noble-gas plasma cleaning procedure may be carried out using a bias power in the range of 0 W up to 2000 W. Preferably the bias power is around 0 Watt to avoid unwanted ion bombardment effect.

According to preferred embodiments, the noble-gas plasma cleaning procedure with or without a preceding WAC cleaning step may be performed in a plasma chamber after each processed substrate (wafer) or after a batch of processed wafers.

Figure 2A:
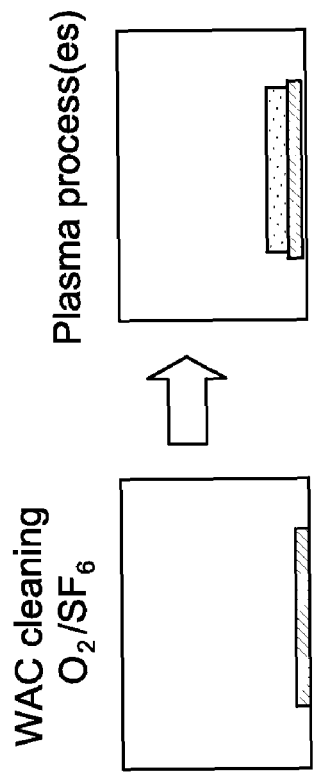
FIG. 2A shows a flow chart illustrating the state of the art plasma chamber cleaning procedure and FIG. 2B illustrates the modified state of the art plasma chamber cleaning procedure including the noble-gas plasma cleaning step.
Figure 2B:
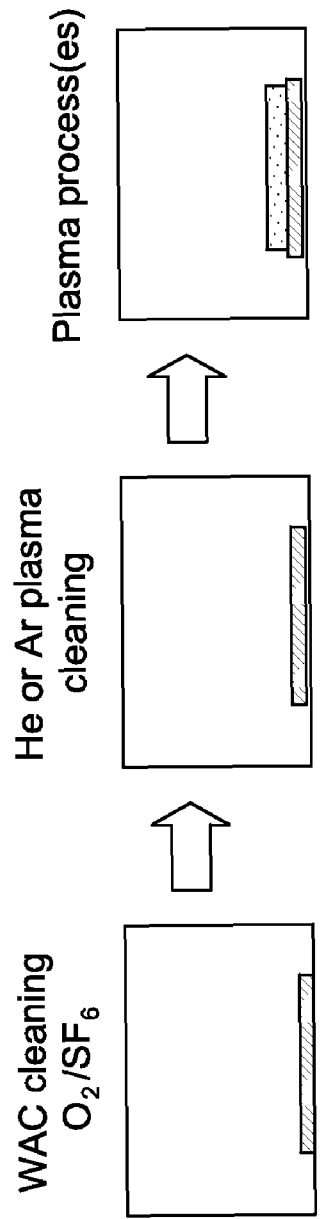

FIG. 2A shows a flow chart illustrating the state of the art plasma chamber cleaning procedure using a WAC cleaning procedure using an $O_2/SF_6$ plasma. FIG. 2B illustrates the improved plasma chamber cleaning procedure including the noble-gas plasma cleaning step. First a WAC cleaning procedure using an $O_2/SF_6$ plasma is performed and subsequently the noble-gas cleaning step is applied (e.g. using a He and/or Ar plasma).

Figures 3A, 3B, 3C:
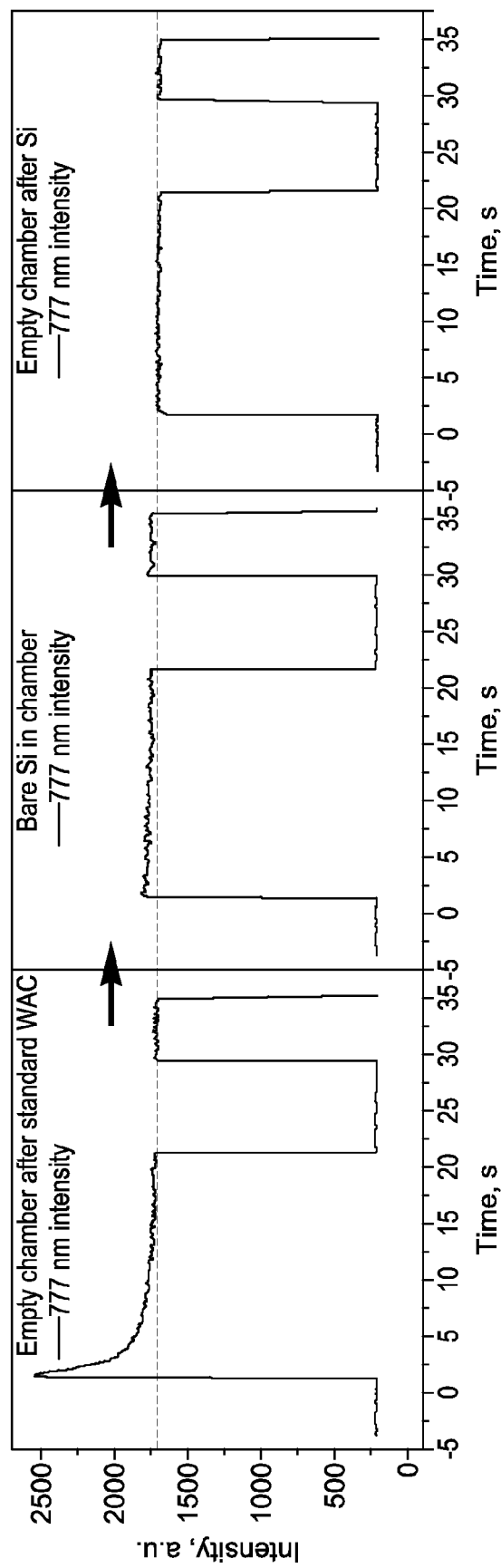
FIG. 3A shows the 777 nm intensity signal in the plasma reaction chamber after performing a WAC cleaning recipe and exposure to a He plasma (empty chamber) which is referred to as He pre-cleaning step.
FIG. 3B reflects the 777 nm intensity signal in the plasma chamber having a Si wafer inside the chamber. The 777 nm signal is higher than that of an empty chamber. This could be related to hydrophilic properties of native Si oxide that covers bare Si. The O* is released from the bonded Si—OH groups.
FIG. 3C illustrates the 777 nm intensity signal after processing the Si-wafer and using a He plasma cleaning step (He post-cleaning step). The 777 nm intensity remains constant, indicating that there are no O* radicals on the walls.

FIG. 3 illustrates the 777 nm intensity signal related to O* radicals (5P-5S transition). The time traces were recalculated from He plasma OES spectra. The presented curves follow maximum of 777 nm intensity as shown in FIG. 3. For all steps the same He plasma recipe was used. The recipe contains a stabilization step. In this step the chamber is filled with He to the required pressure. Then He plasma is ignited for 20 seconds. This is followed by another plasma stabilization step for 8 s and then 6 s of plasma step. This additional 6 s He plasma step is a standard de-chuck step. De-chuck step is used for removing a wafer from the chuck. FIG. 3A shows the 777 nm intensity signal in the plasma reaction chamber after performing a WAC cleaning recipe and exposure to a He plasma (empty chamber) which is referred to as He pre-cleaning step. In this case, the He pre-cleaning step follows the standard WAC $O_2/SF_6$-based step. The $O_2/SF_6$ chemistry is used for the chamber walls cleaning purpose as described in literature. We found that after the WAC O* is released from the chamber walls during the subsequent He plasma treatment. This is reflected by time trace of 777 nm intensity. After 15 s the time trace reaches constant intensity of 1500. This means that chamber walls are cleaned from O*.

FIG. 3B reflects the 777 nm intensity signal in the plasma chamber having a Si wafer inside the chamber. The 777 nm signal is higher than that of an empty chamber. This could be related to hydrophilic properties of native Si oxide that covers bare Si. The O* is released from the bonded Si—OH groups.

FIG. 3C illustrates the 777 nm intensity signal after processing the Si-wafer and using a He plasma cleaning step (He post-cleaning step). The 777 nm intensity remains constant, indicating that there are no O* radicals on the walls.

Figures 3D, 3E, 3F:
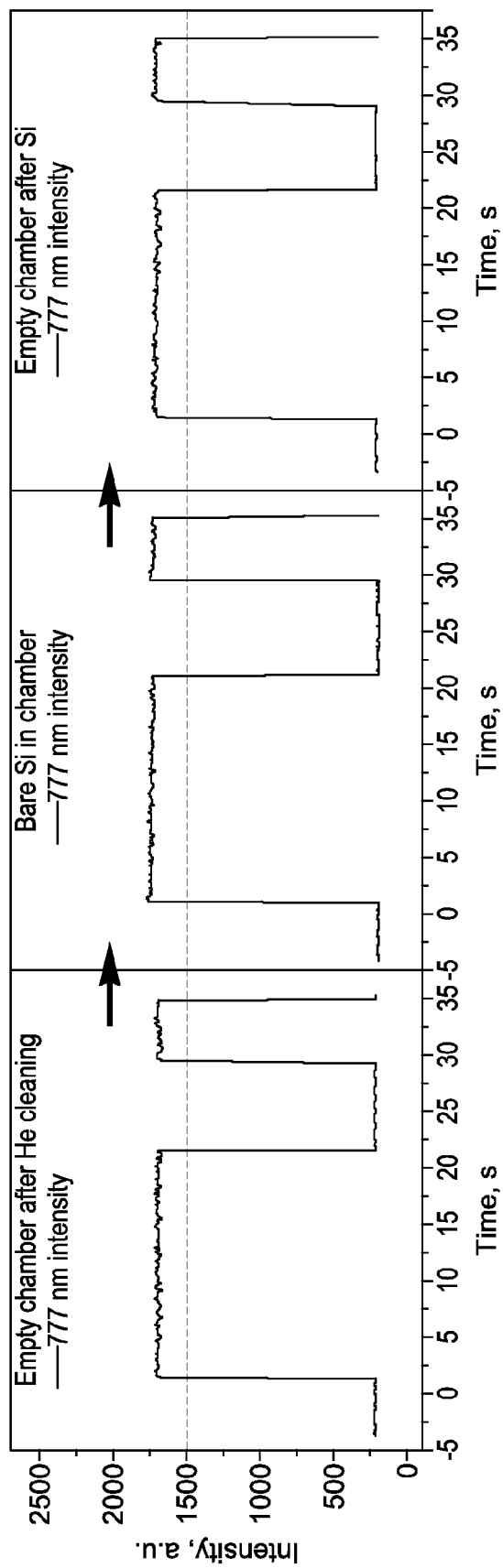
FIGS. 3D, 3E, and 3F shows the same processing steps as described in FIGS. 3A, 3B, and 3C above, but without a WAC cleaning step before performing the precleaning step as illustrated in FIG. 3A.

FIGS. 3D, 3E, and 3F shows the same processing steps as described in FIGS. 3A, 3B, and 3C above, but without a WAC cleaning step before performing the pre-cleaning step as illustrated in FIG. 3A.

It is to be understood that although preferred embodiments, specific constructions and configurations, as well as materials, have been discussed herein for devices according to the preferred embodiments, various changes or modifications in form and detail may be made without departing from the scope of preferred embodiments as defined by the claims.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for removing water residues from a surface of a material in a plasma chamber, the method comprising:
    exposing a surface of a material in a plasma chamber to a noble gas plasma, wherein the noble gas plasma emits at least one of extreme ultra violet and vacuum ultra violet photons having sufficient energy to cause photolysis of water molecules adsorbed to the surface of the material, so as to release at least one of oxygen radicals, hydrogen radicals, and hydroxyl radicals;
    detecting an amount of at least one of released oxygen radicals, released hydrogen radicals, and released hydroxyl radicals by at least one of optical emission spectroscopy, laser induced fluorescence, and mass spectrometry, wherein the detecting is conducted during exposing the surface of the material in the plasma chamber to the noble gas plasma; and
    removing the radicals from the reaction chamber, such that re-deposition of water residues on the surface of the material is avoided.

2. The method of claim 1, wherein detecting an amount of at least one of released oxygen radicals, released hydrogen radicals comprises detecting released oxygen radicals using optical emission spectroscopy at 777 nm.

3. The method of claim 1, wherein the noble gas plasma is a He plasma.

4. The method of claim 1, wherein the step of exposing a surface of a material in a plasma chamber to a noble gas plasma is performed using a noble-gas pressure of from about 0.39 Pa to about 10.66 Pa, at a noble-gas flow rate of from about 100 sccm to about 1500 sccm, and at a plasma power of from about 400 Watt to about 2000 Watt.

5. The method of claim 1, further comprising a step of performing a waferless auto cleaning procedure using at least one of an $O_2/SF_6$ plasma and an $O_2/Cl_2$ plasma, wherein the step of performing is conducted before the step of exposing a surface of a material in a plasma chamber to a noble gas plasma.

6. The method according to claim 1, wherein water residues are removed from at least one inner wall of a reactive ion etching chamber using at least one of a He plasma and an Ar plasma.

7. The method according to claim 1, wherein the method is performed "in-situ".

8. The method according to claim 1, wherein the step of exposing is carried out for a time period of 15 seconds to 100 seconds.

9. The method according to claim 1, wherein the step of exposing is carried out for a time period of 20 seconds to 100 seconds.

* * * * *